United States Patent [19]

Gagnon

[11] Patent Number: 4,916,506
[45] Date of Patent: Apr. 10, 1990

[54] INTEGRATED-CIRCUIT LEAD-FRAME PACKAGE WITH LOW-RESISTANCE GROUND-LEAD AND HEAT-SINK MEANS

[75] Inventor: Jay J. Gagnon, Holden, Mass.

[73] Assignee: Sprague Electric Company, North Adams, Mass.

[21] Appl. No.: 284,003

[22] Filed: Nov. 18, 1988

[51] Int. Cl.$^4$ .............................................. H01L 23/48
[52] U.S. Cl. .......................................... 357/70; 357/74
[58] Field of Search .............................. 357/70, 74, 69

[56] References Cited

U.S. PATENT DOCUMENTS

| | | | |
|---|---|---|---|
| 3,611,061 | 10/1971 | Segerson | 317/234 R |
| 3,930,114 | 12/1975 | Hodge | 174/52 FP |

FOREIGN PATENT DOCUMENTS

| | | | |
|---|---|---|---|
| 0090503 | 5/1983 | European Pat. Off. | 357/70 |
| 62-265745 | 11/1987 | Japan | 357/74 |
| WO86/05322 | 9/1986 | PCT Int'l Appl. | 357/70 |

*Primary Examiner*—Rolf Hille
*Assistant Examiner*—Steven Loke

[57] ABSTRACT

The lead-frame in an integrated circuit package, a dual-inline-package (DIP), has a plurality of leads of which four are extensions of a down-set die-attach pad. A dog-leg finger lines in the plane of the leads and is an extension of a peripheral portion of the die-attach pad. The dog-leg finger has first and second parts that are at right angles to each other so as to lock a distal port of it in the body of encapsulating resin. An integrated circuit die having at least one power transistor is grounded electrically via a terminal and wire bonded to the distal part of the dog-leg finger. This ground circuit parallels and is redundant to a ground circuit through the die via the conductive resin that attaches the bottom of the die to the die-attach pad, the later circuit having a relatively high electrical resistance. The four leads that are extensions of the die-attach pad serve both to remove heat from the die and to provide an electrical ground connection. The extending finger of dog-leg shape provides a point of ground-wire attachment that does not move relative to the encapsulating resin as do other peripheral parts of the die attach pad during temperature cycling.

9 Claims, 1 Drawing Sheet

4,916,506

INTEGRATED-CIRCUIT LEAD-FRAME PACKAGE WITH LOW-RESISTANCE GROUND-LEAD AND HEAT-SINK MEANS

BACKGROUND OF THE INVENTION

This invention relates to an integrated circuit package having one or more lead-frame leads serving both as a ground lead and heat sink means, and more particularly pertains to such a package in which the one or more leads are an extension of and thus are connected to the die-attach pad and are connected electrically via a wire to a terminal on the top die surface.

In packages of the prior art, especially those at the heart of which is an integrated circuit die including logic and power devices, it is known to provide a terminal on the top surface of the die that is connected electrically via a fine gold wire to one lead of a lead frame, wherein that lead extends directly from the die support pad of the lead frame. That one lead will be able to conduct heat from the bottom of the die to the printed wire board circuitry to which that lead would normally be attached by soldering and the like, and thus the lead serves the dual purpose of removing heat and also providing an electrical connection to the terminal at the top of the die. A molded resin body encapsulates the die, the proximal end of all of the lead-frame leads, and all of the fine wire connections between die and proximal ends of the leads.

The fine wire lead from the above-mentioned die terminal connects the terminal either directly to a part of the die-attach pad itself or to the end of a lead-frame finger which extends from the die attach pad to a point that is positioned in line with the proximal ends of the other leads so that all wire-to-lead attach points are in a straight line making the wire bonding task less difficult.

It is an object of this invention to provide an integrated circuit lead-frame package having one or more simple low resistance ground-lead and heat-sink means and having a high tolerance to repeated temperature cycling.

SUMMARY OF THE INVENTION

An integrated-circuit package of this invention includes an integrated circuit die having an electrical terminal on a top face thereof. A sheet-metal lead frame includes a die-attach pad and leads extending away from the die-attach pad. The die is preferably attached to a down-set portion of the pad and makes thermal contact therebetween. One or more of the leads are extensions of the die attach pad and provide a low thermal resistance path between the die and the distal ends of the one or more leads, and also may provide an electrical path between die bottom and the distal ends of the one or more leads.

The lead frame also includes a dog-leg finger having a first portion that is a continuation of and extends from the pad and a second portion extending at right angles from the end of the first portion. A fine metal wire, e.e. gold wire, electrically connects the terminal on the die to the dog-leg finger. A solid resin body encapsulates the die, the pad, the dog-leg finger, the proximal portions of the leads and the wire, leaving the distal ends of all the leads extending outside of and away from the body.

It has been discovered that integrated-circuit lead-frame packages that include one or more leads connected to the die-attach pad serving as a heat-sink ground tab and that employ a wire-bond from the top of the die to the periphery of the die attach pad, fail at a high rate after several hundred temperature cycles.

This invention recognizes that even when the temperature coefficient of expansion of the lead frame metal and that of the solid resin body are nearly the same, changes in temperature of the resin-encapsulated metal lead frame parts occur before the temperature of the solid resin body experiences the same change, and this results in physical movement and displacement between peripheral parts of the die-attach pad and the originally bonded resin. This displacement is most severe at the joint of the die-attach pad and the fine wire, and catastrophic failure of that joint occurs after repeated temperature cycles at that joint even though not at the other wire bond to lead frame joints. The right-angle-extending second portion of the dog-leg finger of this invention securely locks that second finger portion as well as the distal end of the first finger portion in the encapsulating resin.

That locked-in section of the finger is the optimum location of the fine-wire attach point, because there is no movement there between metal and the encapsulating resin. Thus there is little or no wire or wire joint fatigue and fracture after multiple temperature cycles. It also permits downsetting of the die-attach pad to improve wire dress, e.g. arrangement of the wires to optimize ease of connection, and still enables all wire bonding including that of the finger to be made in one plane.

The dog-leg finger of this invention is additionally advantageous in packages such as the preferred embodiment disclosed here, wherein the die-attach pad is large and can accomodate a large die. The total finger may be short and its incorporation in a large-die-attach-pad lead frame including coplanar finger and distal lead portion and a down-set die-attach portion, is accomplished with substantially less difficulty and compromise. The use of more than one such finger and fine wire ground connections is also made feasible. Separate fingers may be used to provide separate wire ground connections from each of several power transistors in the one die. Integrated circuit packages according to this invention offer substantially greater reliability with respect to temperature cycling.

DESCRIPTION OF THE PREFERRED EMBODIMENTS

Figure 1:
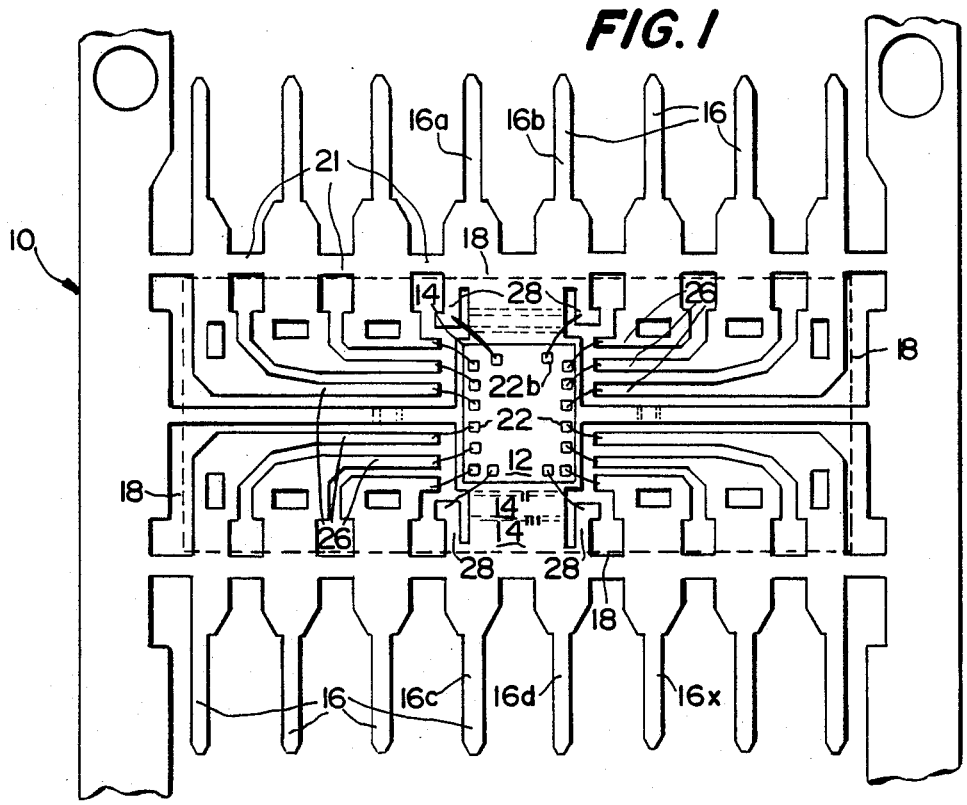
FIG. 1 shows in top view in a stage of manufacture an integrated circuit package including a copper lead frame 10 with an integrated circuit die 12 mounted thereto.
Figure 3:
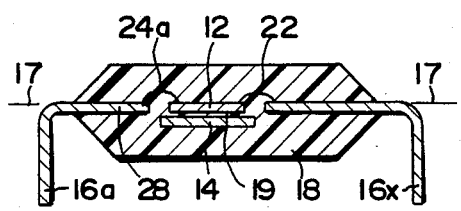
FIG. 3 shows in side sectional view taken in plane 3—3, the integrated circuit package of FIG. 1, in a final stage of manufacture additionally including an encapsulating resin body 50.

Referring to FIG. 1, the lead frame 10 is made by selectively removing portions of a uniformly thick copper sheet, e.g. by punching. A silicon integrated circuit die 12 is mounted to a die-attach pad portion 14. A total of sixteen lead-frame leads 16 extend away from the die 12 and die-attach pad 14. A central portion 14' of the die-attach pad 14 is set down so that after attaching the die 12 there, all wire bonding to the top of the die and the top surface of the proximal portions of the leads may be made all in one plane, a significant advantage in manufacturing. That plane is plane 17 shown in FIG. 3. The die is attached to the down-set die-attach pad portion 14' by use of a layer of conductive polyimide or a soft solder 19. This provides good thermal and electrical contact therebetween.

To establish scale, the distal ends of leads 16 are spaced apart on 100 mil centers, which has been a popular standard for many years. The down-set die-attach pad area 14' is relatively large, amounting to over 10% the area of the final encapsulating resin body in a top-surface plane 17 of the leads. The outline of that area of the resin body 18 is indicated by a dashed line in FIG. 1.

The four center-most of the leads 16, namely 16a, 16b, 16c and 16d, extend directly from the die attach pad 14. These four leads are thus electrically and thermally connected with each other and the die attach pad 14. The copper lead frame 10 has a web 21 between each pair of adjacent leads 16. After body 18 is formed, preferably by molding, the webs 21, located just outside the resin body 18 are removed, with the exception that they may not be removed between the permanently interconnected lead pairs 16a and 16b, and 16c and 16d.

In this embodiment of the invention a relatively large die is employed and thus the down-set part 14' of the die-attach pad is also large and has a width (taken in the direction of the extending leads) when divided by the width (250 mils or 6.4 mm) of the resin body 18 is 0.66. This invention is particularly well suited for packages in which that ratio exceeds 0.55 and may be as large as 0.7.

Figure 2:
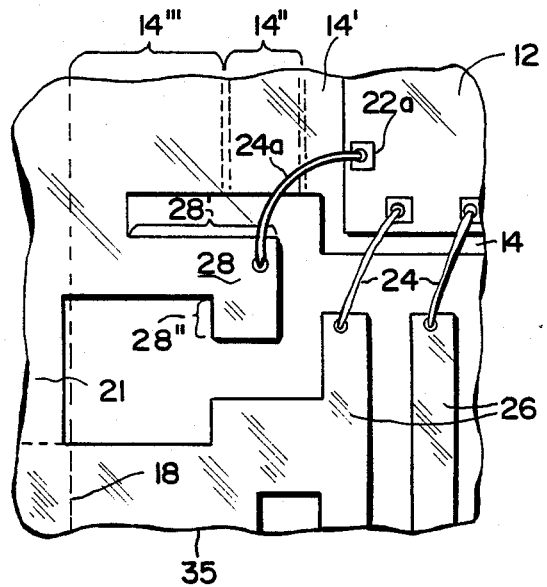
FIG. 2 shows in top view a magnified detail 35 of FIG. 1.

The die 12 has a plurality of circuit terminals 22 on the top surface thereof. Fine gold wires 24 connect the terminals 22 to the proximal ends 26 of the lead-frame leads 16, with the proximal ends of the leads 16a, 16b, 16c and 16d extending directly from the die-attach pad 14. Associated with each of those four leads 16a, 16b, 16c and 16d 3 there is a dog-leg finger 28 extending directly from the die-attach pad 14. Referring to FIG. 2, each dog-leg finger 28 has a first portion 28' that leaves the die-attach pad at a point just inside the resin body 18. A second portion 28" of the finger extends at about right angles from the first finger portion 28'. Note that the dog-leg fingers 28 are constructed such that they remain in the fine wire bonding plane 17 and do not get set down with the center portion 14' of the die-attach pad 14. A transitional ramp portion 14" of the die-attach pad 14 provides continuity between portions 14" in the plane 17 and the down-set portion 14'.

Integrated circuit packages that had been made similar in design to that shown here, except with no special fingers (28) and a fine gold wire (24) connection is made between each die ground terminal (22a, 22b, 22c and 22d) and the die-attach pad (14) beginning at a point just inside, e.g. by about 15 mils, of the body (18). A large number of such packages made without fingers 28, but with four gold ground return wires connected between the die and periphery of the die-attach pad near the side of the body 18 were subjected to a standard temperature cycling test operating between −65° C. and 150° C. to which present day power IC packages are commonly subjected, with the result that a high rate of failures was observed after five hundred cycles. Analysis of the failed parts showed fracturing of the gold wire joint at the die attach pad.

The integrated circuit package of this invention, illustrated in the Figures, has dog-leg fingers 28 to which the gold leads are bonded within the top surface area of the second finger portion 28" or near the distal end area of the first finger portion 28'. This is the dog-leg-finger region that is locked into the resin so that no separation between resin and copper occurs there during temperature cycling. Thus the first portion 28' extends in the opposite direction from that of the distal ends of the leads 16, and the distal end of each dog-leg portion 18' is located close to the die-attach pad 14 to minimize the length and electrical resistance of the fine wire 24. Of course, the use here of four die ground terminals, and four such fingers 28 and fine wires 24 reduces the resistance to ground even further and permits a larger ground return current from an integrated circuit power device. A large number of packages so made show no failures after 3000 cycles of the above-mentioned temperature cycling test.

What is claimed is:

1. An integrated-circuit package comprising:
   a semiconductor integrated-circuit die having two major faces, said die having at least two electrical circuit ground terminals on the top one of said faces;
   a sheet-metal lead frame including (a) a die-attach pad; (b) a plurality of leads extending away from said die-attach pad, the bottom of said die faces being bonded to said die-attach pad to provide a physical and thermal connection between said die and said pad, at least two adjacent of said leads being contiguous with and extending directly from said die-attach pad in the same direction to provide a low thermal and a low electrical resistance path between said pad and the distal ends of said extending leads and (c) at least two dog-leg fingers each having a first portion extending from said pad, and having a second portion at about right angles to said first portion;
   at least two metal wires forming a direct electrical connection respectively between each of said dog-leg fingers and said at least two electrical terminals respectively on said top die face; and
   a solid resin body encapsulating said die, said pad, the proximal ends of said leads and said wires, so that said at least two adjacent leads are enabled to function as heat-sink ground tabs conducting heat and current from said die to the outside of said body.

2. The integrated-circuit package of claim 1 wherein the point of attachment of said metal wires respectively to said dog-leg fingers lies in a top-surface of each of said fingers said area being made up of the entire top surface area of said second-finger portion and the part of the first-finger top surface area that is near the distal end of said first-finger portion.

3. The integrated-circuit package of claim 1 wherein the top surfaces of said proximal ends of said leads lie in one plane and the entire top surface of said dog-leg finger lies in said one plane.

4. The integrated-circuit package of claim 3 wherein a top surface portion of said die-attach pad to which said die is bonded is set downward from said one plane and said top face of said die lies essentially in said one plane.

5. The integrated-circuit package of claim 3 wherein said die-attach pad has a planar portion set down and spaced from but parallel to said one plane so that said top die face is essentially in said one plane.

6. The integrated-circuit package of claim 4 wherein the distal ends of said leads are bent away from said one plane in a direction that is essentially orthogonal to said one plane.

7. The integrated-circuit package of claim 1 wherein said die has a PN-junction-electrical connection through said die itself between said die bottom and said terminal.

8. The integrated-circuit package of claim 1 additionally comprising a plurality of conductive wires forming electrical connections between said proximal ends of some of said leads and several circuit points, respectively, on said top die face.

9. The integrated-circuit package of claim 1 wherein the portions of said at least two adjacent leads that are encapsulated by said resin body are contiguous with each other.

* * * * *